(12) United States Patent
Coorod et al.

(10) Patent No.: US 6,245,995 B1
(45) Date of Patent: Jun. 12, 2001

(54) METHODS AND APPARATUS FOR REMOVING MOISTURE FROM AN ENCLOSURE

(75) Inventors: Scott Coorod; Kamron M. Wright; Peter B. Lytle; Glen Young, all of Fort Wayne, IN (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/467,578

(22) Filed: Dec. 20, 1999

(51) Int. Cl.[7] .................................................. H05K 5/06
(52) U.S. Cl. ............................................................ 174/52.2
(58) Field of Search ................................. 174/52.2, 52.4, 174/52.3; 361/752, 688, 687, 692; 257/712, 710

(56) References Cited

U.S. PATENT DOCUMENTS

| | | | |
|---|---|---|---|
| 5,096,427 | * | 3/1992 | Sadigh-Behzadi ................... 361/759 |
| 5,381,304 | * | 1/1995 | Theroux et al. ..................... 361/706 |
| 5,689,089 | * | 11/1997 | Polak et al. ......................... 274/52.4 |

* cited by examiner

Primary Examiner—Shawn Riley
(74) Attorney, Agent, or Firm—Carl B. Horton, Esq.; Damian Wasserbauer, Esq.; Armstrong Teasdale, LLP

(57) ABSTRACT

A control board enclosure includes an opening extending through a side wall to permit moisture to drain from the enclosure and a potting compound to protect the control board. A plug is sized to fit in sealable contact with the opening. The potting material is placed within the enclosure to cover the control board and a portion of the plug. A drainage channel is formed and extends to the opening through the potting compound when the plug is removed from the enclosure.

18 Claims, 3 Drawing Sheets

METHODS AND APPARATUS FOR REMOVING MOISTURE FROM AN ENCLOSURE

BACKGROUND OF THE INVENTION

This invention relates generally to enclosures and, more particularly, to enclosures that include a potting compound covering a control board.

Often control boards including electronic components are mounted within enclosures which protect the control board from direct exposure to environmental conditions. However, when the enclosures are used in outdoor applications, often the changing environmental conditions can create condensation within the enclosure. Such moisture may damage the control board and the electronic components leading to a failure of the control board or an associated device electrically connected to the control board.

Known enclosures include small drain holes to permit moisture to drain from the enclosure. Additionally a potting material is poured within the enclosure over the control board to provide additional protection from moisture. Because the electronic components vary between control boards, the level of potting material used varies between enclosures. As the level of potting material changes, often the position of the small drain holes permitted the potting material to overflow through the holes and plug the holes. Other drain hole locations permit too much moisture to accumulate on a top surface of the potting material before permitting the moisture accumulation to drain from the enclosures, thus increasing the risk of the moisture damaging the control board.

BRIEF SUMMARY OF THE INVENTION

In an exemplary embodiment, an enclosure includes a control board, an opening to permit moisture to drain from the enclosure, and a potting compound to protect the control board mounted within the enclosure. When cured, a channel is formed within the potting compound extending from a top surface of the potting material to the opening. The opening extends through a side wall of the enclosure and is sized to receive a plug. The plug is sized to fit in sealable contact within the opening.

During assembly, the control board is mounted within the enclosure such that an edge of the control board is positioned a height from a bottom of the enclosure that is between a top and a bottom of the opening. The plug is inserted within the opening and seals the opening. When the potting compound is placed within the enclosure, the control board and a portion of the plug are covered with the potting compound. After the potting compound is cured, the plug is removed leaving a drainage channel extending through the potting compound to the opening.

DETAILED DESCRIPTION OF THE INVENTION

Figure 1:
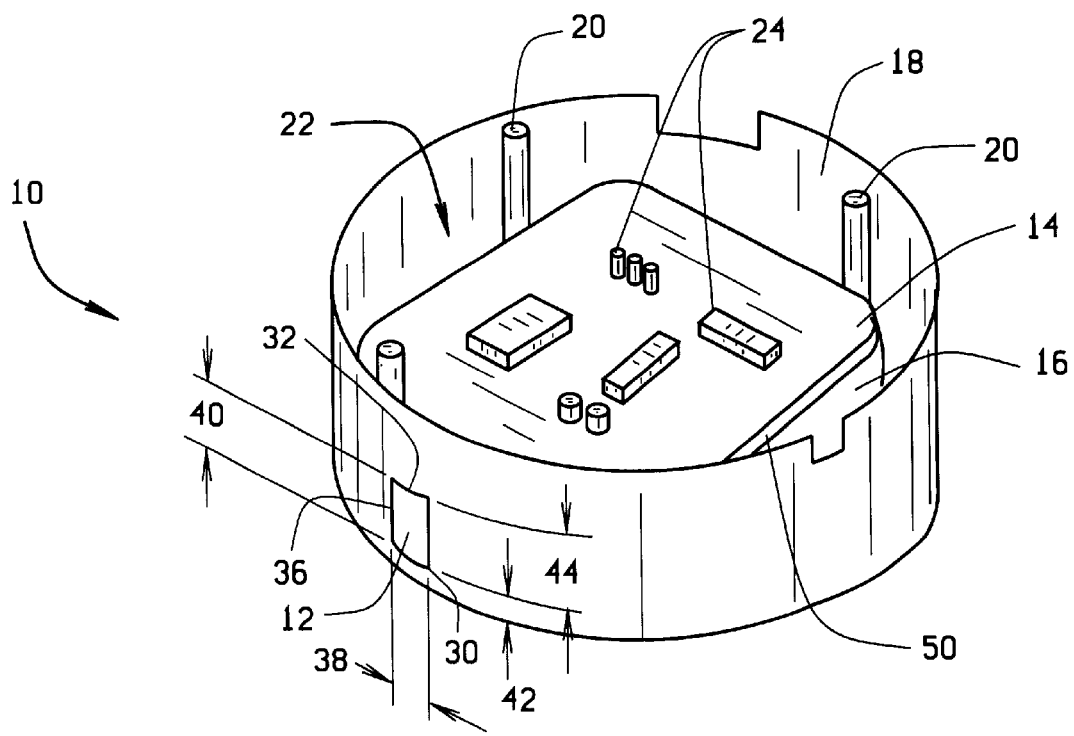
FIG. 1 is a perspective view of an enclosure including a drain opening.

FIG. 1 is a perspective view of an enclosure 10 including a drain opening 12 and a control board 14. Enclosure 10 further includes a bottom 16, a side wall 18, and a plurality of mounting posts 20. Bottom 16 is circular and side wall 18 extends circumferentially and substantially perpendicularly from bottom 16. Side wall 18 and bottom 16 define a cavity 22. Mounting posts 20 extend substantially perpendicularly from bottom 16 and are sized to receive mounting screws (not shown). In one embodiment, enclosure 10 is attached to an outdoor electronically commutated motor, ECM, (not shown) which is part of an outdoor condenser fan assembly (not shown). Control board 14 is mounted to enclosure 10 within cavity 22 and includes a plurality of electronic control components 24. Enclosure 10 shields control board 14 from the environment.

Opening 12 extends through side wall 18 and has a generally rectangular shape sized to receive a plug (not shown in FIG. 1). Opening 12 is defined by a bottom edge 30 connected to a top edge 32 with a first side edge 34 and a second side edge 36. Additionally, opening 12 has a width 38 extending between first side edge 34 and second side edge 36 and a height 40 extending between bottom edge 30 and top edge 32. In one embodiment, opening width 38 is slightly larger than 0.22 inches and height 40 is slightly larger than 0.55 inches. Opening 12 is oriented such that bottom edge 30 is substantially parallel to enclosure bottom 16 and is located a first distance 42 from bottom 16. Additionally, top edge 32 is located a second distance 44 from bottom 16 which is greater than first distance 42.

Figure 2:
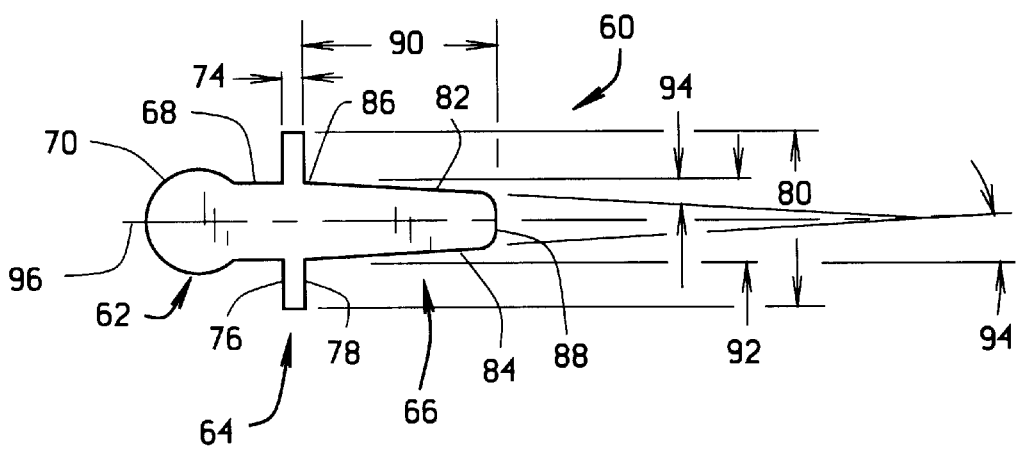
FIG. 2 is a top elevational view of a plug used with the enclosure shown in FIG. 1.

FIG. 2 is a top elevational view of a plug 60 sized to be inserted within drain opening 12 (shown in FIG. 1) of enclosure 10 (shown in FIG. 1). Plug 60 is symmetrical and includes a grip portion 62, a stop portion 64, and an insert portion 66. Grip portion 62 includes a first body portion 68 and a second body portion 70. First body portion 68 extends from stop portion 64 and has a generally rectangular cross-sectional profile. Second body portion 70 extends from first body portion 68 and has a generally truncated circular cross sectional profile.

Stop portion 64 extends from grip portion 62 and has a substantially rectangular cross-sectional profile. Stop portion 64 has a thickness 74 extending between an outer surface 76 of stop portion 64 to an inner surface 78 of stop portion 64. Outer surface 76 is adjacent plug grip portion 62 and inner surface 78 extends from plug insert portion 66. Stop portion 64 has a width 80 extending from a left side 82 of stop portion 64 to a right side 84 of stop portion 64. Width 80 is wider than opening width 38 (shown in FIG. 1). Accordingly, when plug 60 is fully inserted within enclosure side wall opening 12, stop portion inner surface 78 contacts side wall 18.

Plug insert portion 66 extends from a base 86 to a first end 88 of plug 60 a distance 90. In one embodiment, distance 90 is approximately 0.55 inches. Insert portion base 86 extends from plug stop portion 64 and has a width 92 less than stop portion width 80. Insert portion 66 is chamfered and tapers at an angle 94 from insert portion base 86 to first end 88. In one embodiment, angle 94 is approximately 2.5 degrees measured with respect to a first axis of symmetry 96.

Figure 3:
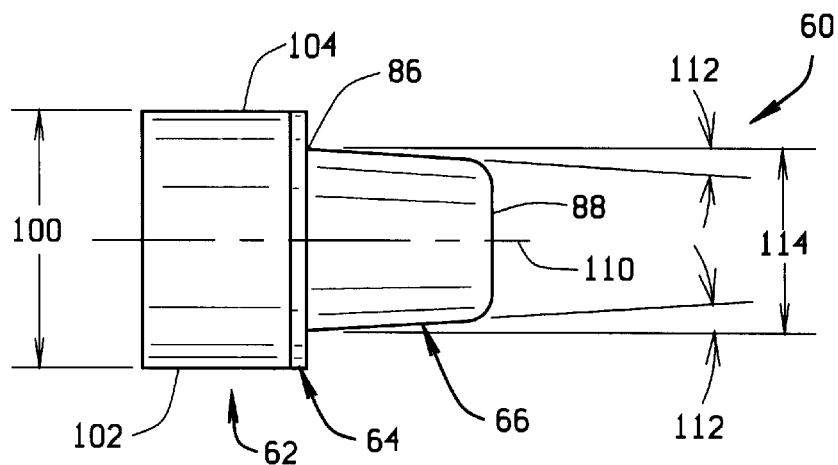
FIG. 3 is a side elevational view of the plug shown in FIG. 2.

FIG. 3 is a side elevational view of plug 60. Plug grip portion 62 and plug stop portion 64 have a height 100 extending from a bottom 102 of plug 60 to a top 104 of plug 60. In one embodiment, height 100 is approximately 0.75 inches. Height 100 is greater than opening height 40 (shown in FIG. 1). Accordingly, when plug 60 is fully inserted within enclosure side wall opening 12 (shown in FIG. 1), stop portion inner surface 78 contacts side wall 18 along opening bottom edge 30 (shown in FIG. 1), top edge 32 (shown in FIG. 1), first side edge 34 (shown in FIG. 1), and second side edge 36 (shown in FIG. 1).

Plug insert portion 66 tapers at an angle 112 with respect to a second axis of symmetry 110 from insert portion base 86 to plug first end 88. In one embodiment, angle 112 is approximately 2.5 degrees. Insert portion base 86 has a height 114 less than plug stop portion height 100.

Figure 4:
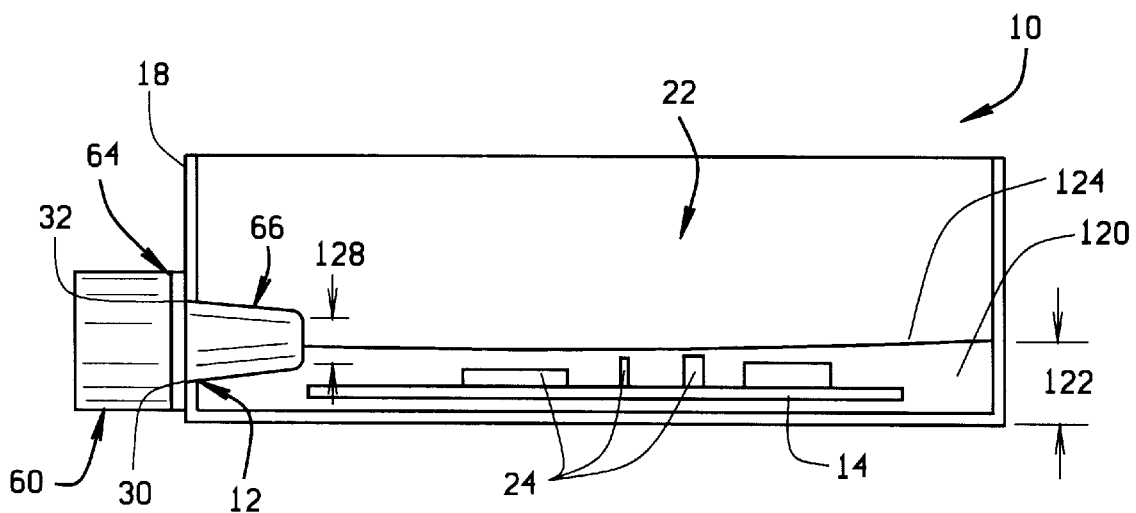
FIG. 4 is a cross-sectional view of the enclosure shown in FIG. 1 including an installed plug.

FIG. 4 is a cross-sectional view of enclosure 10 including installed plug 60 and control board 14. During assembly of enclosure 10, control board 14 is mounted to enclosure 10 and plug 60 is fully inserted within enclosure side wall opening 12. When plug 60 is fully inserted within opening 12, plug stop portion 64 contacts side wall 18 while plug insert portion 66 extends through side wall 18 into cavity 22. Plug insert portion 66 is sized to fit in sealable contact with side wall opening 12.

After plug 66 is installed, a potting compound 120 is added to cavity 22. Potting compound 120 is a two-part polyurethane material added to cavity 22 to cover control board 14 and protect control board 14 and electronic control components 24 from moisture which may accumulate as a result of weather or condensation. In one embodiment, potting compound 120 is UR-330, parts A and B, available from Thermoset, Lord Chemical, Indianapolis, Ind. Accordingly, a level 122 of potting compound 120 is added such that a top surface 124 of potting compound 120 covers control board 14 and at least a portion, but not all, of plug insert portion 66. After potting compound 120 has cured, at least a portion of potting compound top surface 124 has a height 122 from enclosure bottom 16 measured along side wall opening 12 between opening bottom edge 30 and opening top edge 32. Having potting compound 120 at height 122 ensures that a portion 128 of plug insert portion 66 is not covered by potting compound 120. Portion 128 is variable and is dependent on an amount of potting compound 120 placed within enclosure 10. Plug 60 is fabricated from a material to which potting compound 120 will not stick. In one embodiment, plug 60 is a silicone material available from Atlantic India Rubber Company, 1425 Lake Avenue, Woodstock, Ill., 60098. Accordingly, after potting compound 120 is cured, plug 60 removable from opening 12.

Figure 5:
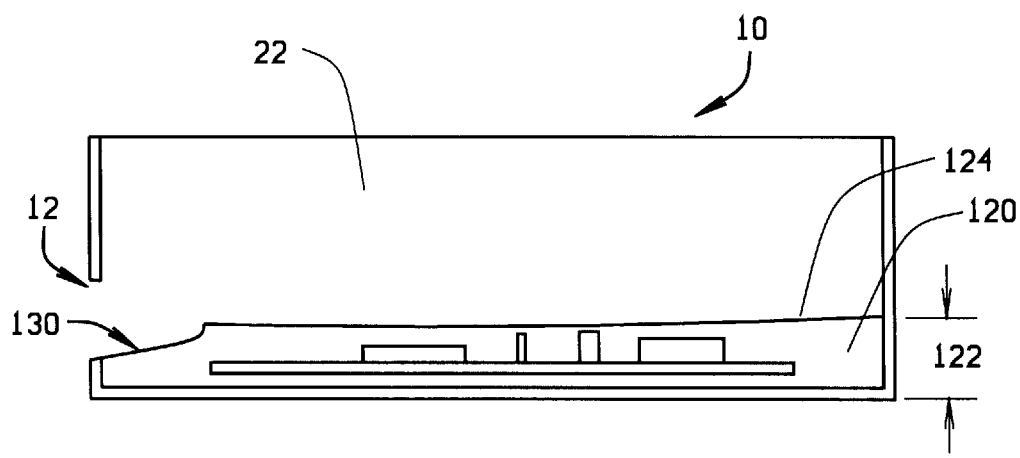
FIG. 5 is a cross-sectional view of the enclosure shown in FIG. 4 without the installed plug.

FIG. 5 is a cross-sectional view of enclosure 10 after plug 60 (shown in FIG. 4) has been removed. After potting compound 120 is fully cured, plug 60 is removed and a channel 130 remains within potting compound 120. Because potting compound 120 was initially poured to height 122 to ensure plug insert portion 66 was not fully covered with potting compound 120, channel 130 extends from side wall opening 12 to potting compound top surface 124. Furthermore, because plug insert portion 66 is tapered, channel 130 slopes from cavity 22 towards side wall opening 12. Accordingly, moisture accumulating within cavity 22 on potting compound top surface 124 is channeled through channel 130 and outward from cavity 22 through side wall opening 12.

The above-described enclosure is cost-effective and highly reliable. The enclosure includes an opening to permit moisture to drain from the enclosure, and a potting compound to protect the control board mounted within the enclosure. When cured, a channel is formed within the potting compound extending from a top surface of the potting material to the opening. The opening extends through a side wall of the enclosure and is sized to receive a plug in sealable contact. The plug and opening are sized such that regardless of the height of the control board from the bottom of the enclosure, a plug top surface has a greater height from the bottom surface of the enclosure than does the control board. Therefore, after the potting material is poured over the control board and a portion of the plug, removing the plug forms the channel within the potting compound. As a result, an enclosure is provided which effectively removes moisture from a control board positioned over a wide range of locations within the enclosure.

While the invention has been described in terms of various specific embodiments, those skilled in the art will recognize that the invention can be practiced with modification within the spirit and scope of the claims.

What is claimed is:

1. A method for removing moisture from an enclosure including a control board, the enclosure including a bottom, a side wall extending from the bottom and potting compound, the side wall including an opening extending therethrough and defined by a bottom edge and a top edge, the opening extending therebetween, the bottom edge located a first distance from the enclosure bottom, the top edge located a second distance from the enclosure bottom, the potting compound within the enclosure and covering the enclosure bottom, said method comprising the steps of:

mounting the control board within the enclosure;

placing the potting compound within the enclosure such that at least a portion of the potting compound covers the bottom of the enclosure and has a height between the first distance and the second distance; and permitting moisture to exit the enclosure through the opening.

2. A method in accordance with claim 1 wherein the potting compound includes a top surface having a height from the bottom surface, said step of placing the potting compound further comprising the step of forming a channel within the potting compound adjacent the side wall opening.

3. A method in accordance with claim 2 wherein the step of forming the channel further comprising the step of extending the channel from the potting compound top surface to the side wall opening.

4. A method in accordance with claim 3 wherein the channel slopes toward the opening, said step of forming the channel further comprising the step of sloping the channel towards the opening.

5. A method in accordance with claim 1 wherein the enclosure further includes a plug sized to be removably inserted within the side wall opening, said step of forming the channel further comprising the step of inserting the plug within the side wall opening prior to placing the potting compound within the end cap.

6. A method in accordance with claim 5 wherein the plug includes a grip portion, a stop portion, and an insert portion, the stop portion between the grip portion and the insert portion and extending from the grip portion, the insert portion extending from the stop portion, the plug fabricated from a material that will not stick to the potting compound, said step of inserting the plug further comprising the step of inserting the plug into the side wall opening such that the insert portion extends within the opening and the stop portion contacts the side wall.

7. A method in accordance with claim 6 wherein the plug insert portion includes a top side, a bottom side, and a thickness extending between the top side and the bottom side, the potting compound further includes a top surface, said step of placing the potting compound further comprising the step of placing the potting compound within the enclosure such that the potting compound top surface covers at least a portion of the plug insert portion below the top side of the plug insert portion.

8. A method in accordance with claim 7 wherein the plug is fabricated from a material such that the potting compound will not stick to the plug, the plug further including a first end, the insert portion tapered from the stop portion to the first end, said method further comprising the step of forming a tapered channel within the potting compound by removing the plug from the side wall opening after the pottting compound has cured.

9. An enclosure configured to receive a control board, said enclosure comprising:
   a bottom;
   a side wall extending from said bottom and comprising an opening therethrough, said opening comprising a bottom and a top, said opening bottom closer to said enclosure bottom than said opening top; and
   potting compound within said enclosure and covering said enclosure bottom, at least a portion of said potting compound comprising a height from said enclosure bottom between said opening top and said opening bottom.

10. An enclosure in accordance with claim 9 wherein said potting compound further comprises a top surface and a channel, at least a portion of said top surface between said opening bottom and said opening top, said channel adjacent said opening.

11. An enclosure in accordance with claim 10 wherein said channel extends from said potting compound top surface to said side wall opening.

12. An enclosure in accordance with claim 11 wherein said channel slopes towards said side wall opening.

13. An enclosure in accordance with claim 11 further comprising a plug sized to be removably inserted within said side wall opening.

14. An enclosure in accordance with claim 13 wherein said plug comprises a grip portion, a stop portion, and an insert portion, said stop portion between said grip portion and said insert portion and extending from said grip portion, said insert portion extending from said stop portion.

15. An enclosure in accordance with claim 14 wherein said plug further comprises a first end, said insert portion tapered from said stop portion to said first end.

16. An enclosure in accordance with claim 15 wherein said plug comprises a material such that said potting compound will not stick to said plug insertion portion when said potting compound is uncured.

17. An enclosure in accordance with claim 16 wherein said plug material is silicon.

18. An enclosure in accordance with claim 16 wherein said plug insert portion comprises a top side, a bottom side, and a thickness extending between said insert portion top side and said insert portion bottom side, said thickness slightly less than a distance between said opening bottom and said opening top.

* * * * *

UNITED STATES PATENT AND TRADEMARK OFFICE
CERTIFICATE OF CORRECTION

PATENT NO. : 6,245,995 B1
DATED : June 12, 2001
INVENTOR(S) : Coonrod et al.

It is certified that error appears in the above-identified patent and that said Letters Patent is hereby corrected as shown below:

<u>Title page,</u>
Item [75], change the first inventor as follows, delete "Coorod" and insert therefor
-- Coonrod --.

Signed and Sealed this

Twenty-second Day of July, 2003

JAMES E. ROGAN
*Director of the United States Patent and Trademark Office*